(12) United States Patent
Kuo et al.

(10) Patent No.: US 6,529,050 B1
(45) Date of Patent: Mar. 4, 2003

(54) HIGH-SPEED CLOCK BUFFER THAT HAS A SUBSTANTIALLY REDUCED CROWBAR CURRENT

(75) Inventors: James R. Kuo, Cupertino, CA (US); Tuong Hoang, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/933,453

(22) Filed: Aug. 20, 2001

(51) Int. Cl.$^7$ ................................................. H03K 3/00
(52) U.S. Cl. ......................................... 327/112; 326/83
(58) Field of Search ........................ 327/108–112, 434, 327/437, 436; 326/82, 83, 86

(56) References Cited

U.S. PATENT DOCUMENTS

| | | | |
|---|---|---|---|
| 4,785,203 A | * 11/1988 | Nakamura | 326/87 |
| 4,789,796 A | * 12/1988 | Foss | 326/27 |
| 4,833,349 A | * 5/1989 | Liu et al. | 326/50 |
| 5,148,056 A | * 9/1992 | Glass et al. | 326/87 |
| 5,216,300 A | * 6/1993 | Wabuka | 326/87 |
| 5,231,311 A | 7/1993 | Ferry et al. | 326/27 |
| 5,438,278 A | 8/1995 | Wong et al. | 326/27 |
| 5,610,548 A | 3/1997 | Masleid | 327/374 |
| 5,760,620 A | 6/1998 | Doluca | 327/112 |
| 5,773,999 A | * 6/1998 | Park et al. | 327/108 |
| 5,801,550 A | 9/1998 | Tanaka | 326/87 |
| 5,994,921 A | * 11/1999 | Hedberg | 326/81 |
| 6,072,333 A | * 6/2000 | Tsukagoshi et al. | 326/58 |
| 6,163,174 A | * 12/2000 | Friedman et al. | 326/108 |
| 6,169,421 B1 | * 1/2001 | Bryan et al. | 326/83 |
| 6,172,516 B1 | * 1/2001 | Han et al. | 326/27 |
| 6,184,729 B1 | * 2/2001 | Pasqualini | 327/112 |
| 6,307,409 B1 | * 10/2001 | Wrathall | 327/112 |

\* cited by examiner

Primary Examiner—Kenneth B. Wells
(74) Attorney, Agent, or Firm—Mark C. Pickering

(57) ABSTRACT

The crowbar current in a driver inverter, which has a pair of complementary driver transistors, is substantially reduced by adjusting the turn on and turn off times of the p-channel and n-channel driver transistors such that each driver transistor turns on after the other driver transistor has been turned off.

27 Claims, 5 Drawing Sheets

HIGH-SPEED CLOCK BUFFER THAT HAS A SUBSTANTIALLY REDUCED CROWBAR CURRENT

BACKGROUND OF THE INVENTION

1. Field of the Invention

The present invention relates to a clock buffer and, more particularly, to a high-speed clock buffer that has a substantially reduced crowbar current.

2. Description of the Related Art

A clock buffer is a device that drives a clock signal onto a capacitive load such as, for example, a clock tree. Current generation clock trees, where a single clock signal drives a number of clock inputs, typically have a loading capacitance that ranges from approximately 10 pF to 100 pF, depending on the size of the system.

There are many applications, such as in communication networks, where the edge transitions of the clock signal are critical to the operation of the system. Thus, it is critical to those systems that the clock buffer has sufficient drive for the load which, in the case of a clock tree, can be substantial.

FIG. 1 shows a schematic diagram that illustrates a conventional clock buffer 100. As shown in FIG. 1, buffer 100 includes an inverter 110 and a driver inverter 120. Inverter 110 has an input and an output, while driver inverter 120 has an input that is connected to the output of inverter 110, and an output.

As shown in FIG. 1, driver inverter 120 includes a p-channel transistor P1 and an n-channel transistor N1. P-channel transistor P1 has a source connected to VCC (a power supply node), a drain, and a gate connected to the output of inverter 110. N-channel transistor N1 has a source connected to ground, a drain connected to the drain of transistor P1, and a gate connected to the output of inverter 110.

Transistors P1 and N1 are sized to provide sufficient drive to the load. As a result, transistors P1 and N1 are typically much larger than the transistors used to form inverter 110. In addition, as the capacitive loading (of the clock trees) increases, it is common practice to further increase the sizes of transistors P1 and N1 to provide the extra current drive.

In operation, inverter 110 receives a clock signal CLK, inverts the clock signal CLK, and outputs a first inverted clock signal CLK1. Driver inverter 120, in turn, receives the first inverted clock signal CLK1, inverts the clock signal CLK1, and outputs a second inverted clock signal CLK2. Buffer 100 is non-inverting because the input clock signal CLK and the second inverted clock signal CLK2 have the same logic state.

With respect to driver inverter 120, p-channel transistor P1 turns on and conducts when the source-to-drain voltage VSD is greater than zero (e.g., VSD>0), and the gate-to-source voltage VGS is less than the threshold voltage VTP of the transistor (e.g., VGS<VTP). N-channel transistor NI turns on and conducts when the drain-to-source voltage VDS is greater than zero (e.g., VDS>0), and the gate-to-source voltage VGS is greater than the threshold voltage VTN of the transistor (e.g., VGS>VTN).

One of the advantages of buffer 100 is that when the voltages of the clock signal CLK and the first inverted clock signal CLK1 are at CMOS levels, no current is dissipated. For example, when the voltage of the first inverted clock signal CLK1 is at ground, p-channel transistor P1 is turned on and n-channel transistor N1 is turned off. Similarly, when the voltage of the first inverted clock signal CLK1 is at VCC, p-channel transistor PI is turned off and n-channel transistor N1 is turned on.

One of the disadvantages of buffer 100, however, is that transistors P1 and N1 of inverter 120 both turn on and conduct during a portion of the rising and falling edges of the inverted clock signal CLK1. (The transistors of inverter 110 also turn on and conduct during a portion of the rising and falling edges of the clock signal CLK, but since the transistors that make up inverter 110 are substantially smaller than transistors P1 and N1 the effect is much less significant.)

Although clock signals are typically depicted as instantaneously changing logic states (from a logic low to a logic high or vice versa), in actual practice a finite time, such as 100–200 pS, is required for the signal to change logic states, particularly if a relatively large capacitive load is present.

FIG. 2 shows a timing diagram that illustrates the first inverted clock signal CLK1 input to inverter 120. As shown in FIG. 2, clock signal CLK1 starts as a logic low voltage VL at time t0, and begins transitioning from a logic low to a logic high at time t1. At time t2, clock signal CLK passes a turn on voltage V1 for transistor N1 (equal to the threshold voltage VTN of transistor N1), and at time t3 passes a turn off voltage V2 for transistor P1 (where the gate-to-source voltage is greater than the threshold voltage VTP). Clock signal CLK1 then reaches a logic high voltage VH at time t4.

From time t0 to time t1, transistor P1 is turned on charging the load to a logic high, while transistor N1 is turned off. At time t2, however, the voltage on the gates of transistors P1 and N1 has risen to a point where the gate-to-source voltage (VGS) of transistor N1 is greater than the threshold voltage of transistor N1. As a result, transistor N1 turns on.

Thus, both transistors P1 and N1 remain turned on until clock signal CLK1 passes time t3 when the gate-to-source voltage (VGS) of transistor P1 is no longer less than the threshold voltage of transistor P1. This, in turn, causes transistor P1 to turn off. Thus, from time t2 to time t3 (about 80% of the rise time), both transistors P1 and N1 are turned on. A similar situation occurs on the falling edge of clock signal CLK1.

When transistors P1 and N1 are both turned on at the same time, a current ICB (see FIG. 1), known as a crowbar current, flows directly from transistor P1 to transistor N1. The crowbar current is an undesirable current because the crowbar current consumes power and slows down the response time of the circuit by increasing the rise and fall time of the clock signal CLK2.

The rise and fall times are increased because the crowbar current ICB that is sunk by transistor N1 is unavailable to charge the load on the falling edge of the clock signal CLK1, and limits the current that can be sunk from the load on the rising edge of the clock signal CLK1. By restricting the current that can be used to charge or discharge the load, the rise and fall times are necessarily increased. In addition, the crowbar current can cause supply and ground noise. Thus, there is a need for a driver inverter that substantially reduces the crowbar current.

SUMMARY OF THE INVENTION

The present invention substantially reduces the crowbar current in a driver inverter, which has a pair of complementary driver transistors, by adjusting the turn on and turn off times of the driver transistors such that each driver transistor turns on after the other driver transistor has turned off.

A buffer in accordance with the present invention includes a pull up block that receives an input signal which, in turn, has a plurality of edges. The pull up block outputs a first signal in response to the input signal a delay time after the input signal is received. The first signal beginning a transition from a first logic level to a second logic level at a first time.

The buffer also includes a first driver transistor that is connected to the pull up block and an output node. The first driver transistor receives the first signal, sources a first current to the output node when a voltage level of the first signal is in a first voltage range, and stops the first current when the voltage level of the first signal is in a second voltage range.

The buffer further includes a pull down block that is connected to the pull up block. The pull down block receives the input signal and outputs a second signal in response to the input signal a delay time after the input signal is received. The second signal beginning a transition from the first logic level to the second logic level at a second time. The second time being different from the first time.

The buffer additionally including a second driver transistor that is connected to the pull down block and the output node. The second driver transistor receives the second signal, sinks a second current from the output node when a voltage level of the second signal is in a first voltage range, and stopps the second current when the voltage level of the second signal is in a second voltage range.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
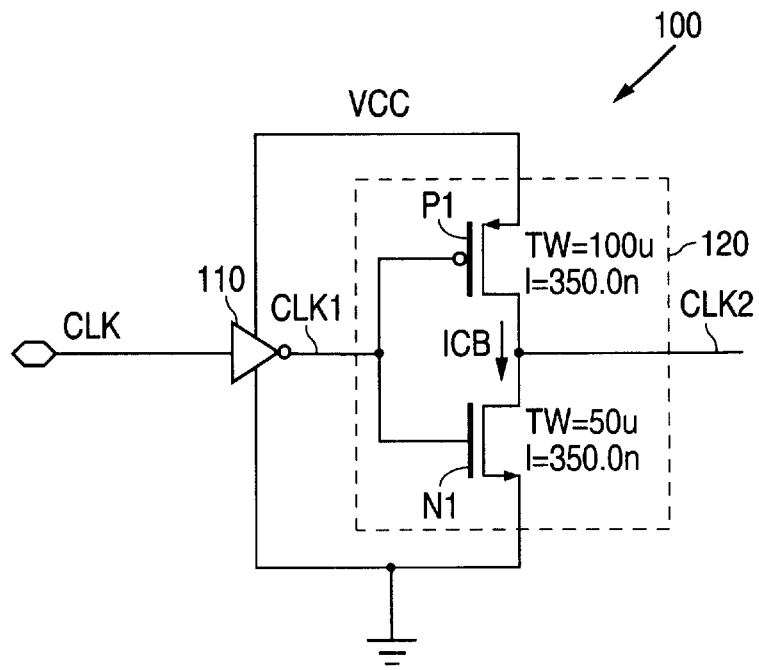
FIG. 1 is a schematic diagram illustrating a conventional clock buffer 100.
Figure 2:
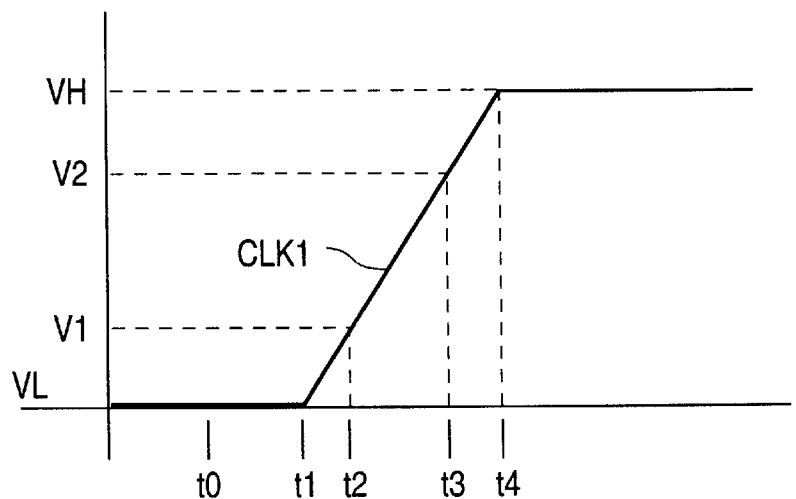
FIG. 2 is a timing diagram illustrating the first inverted clock signal CLK1 input to inverter 120.
Figure 3:
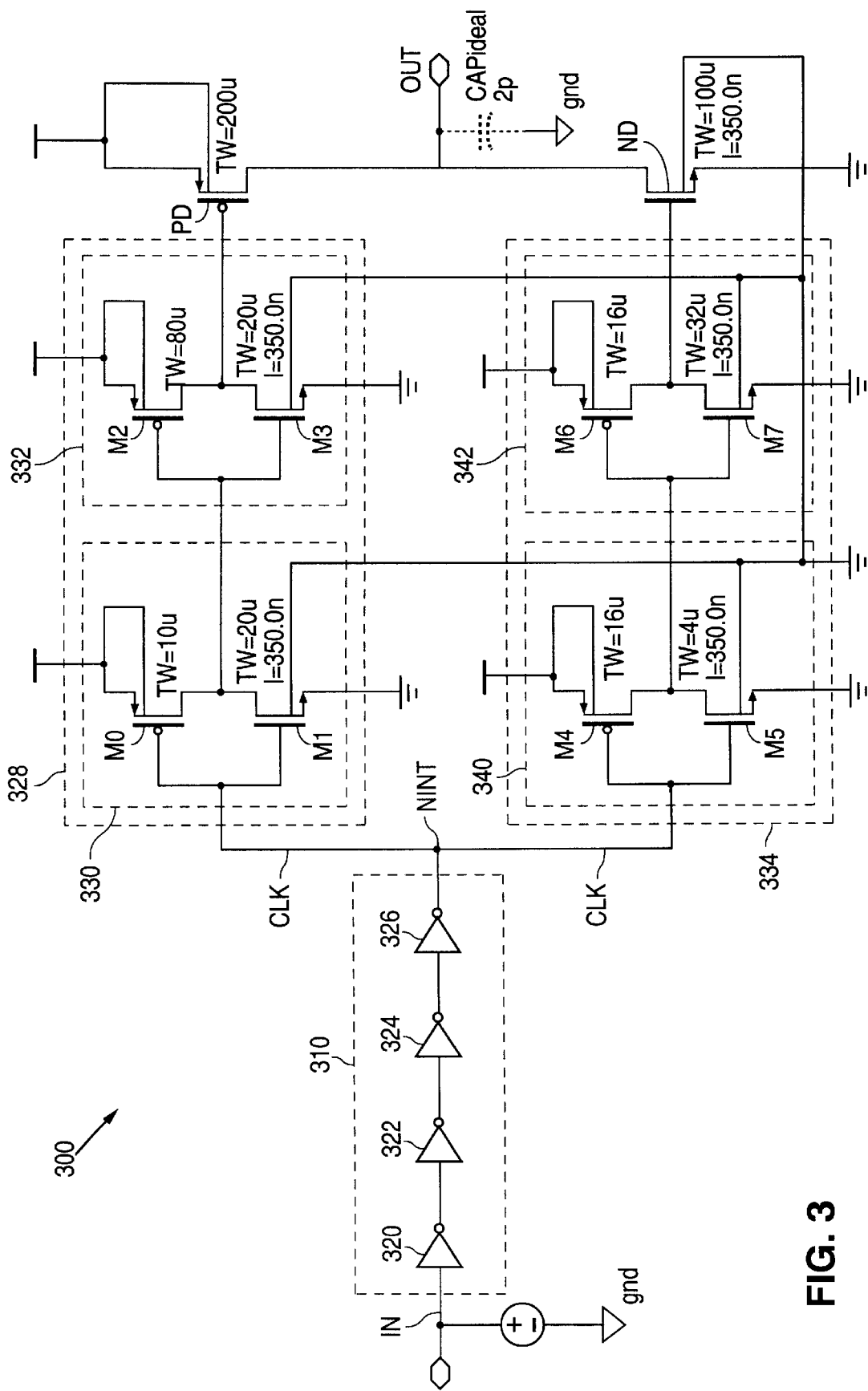
FIG. 3 is a schematic illustrating a clock buffer 300 in accordance with the present invention.

FIG. 3 shows a schematic that illustrates a clock buffer 300 in accordance with the present invention. As described in greater detail below, buffer 300 substantially reduces the crowbar current in a driver inverter, which has a pair of complementary driver transistors, by adjusting the turn on and turn off times of the driver transistors such that each driver transistor turns on after the other driver transistor has turned off.

As shown in FIG. 3, buffer 300 includes an inverter block 310 that receives an input clock signal IN and outputs an intermediate clock signal CLK. In the example shown in FIG. 3, inverter block 310 has a first inverter 320 that has an input and an output, and a second inverter 322 has an input connected to the output of inverter 320, and an output. In addition, a third inverter 324 has an input connected to the output of inverter 322, and an output, while a fourth inverter 326 has an input connected to the output of inverter 324, and an output connected to an intermediate node NINT.

Buffer 300 also includes a pull up block 328 that includes a first pull up inverter 330 and a second pull up inverter 332. First pull up inverter 330 has an input connected to the intermediate node NINT and an output, while second pull up inverter 332 has an input connected to the output of inverter 330, and an output.

First pull up inverter 330 has a p-channel transistor M0 and an n-channel transistor M1. Transistor M0 has a gate connected to the intermediate node NINT, a source connected to a power supply node, and a drain. Transistor M1 has a gate connected to the intermediate node NINT, a source connected to ground, and a drain connected to the drain of transistor M0.

In accordance with the present invention, transistors M0 and M1 have substantially the same length, e.g., 350$u$, while transistor M1 is twice as wide as transistor M0, e.g., M0=10$u$ and M1=20$u$. Since the mobility of electrons is about twice that of holes, transistor M1 sinks four times (4 X) more current than transistor M0 sources. ($\beta=\mu CW/L$ where $\mu$ represents the charge carrier mobility, C represents the transistor gate capacitance, W represents the transistor width, and L represents the transistor length. In addition, other lengths and widths can be used to obtain the four times (4 X) factor or another factor.) Thus, transistor M1 can pull down the voltage on the input of inverter 332 four times faster than transistor M0 can pull up the voltage on the input of inverter 332.

Second pull up inverter 332 has a p-channel transistor M2 and a n-channel transistor M3. Transistor M2 has a gate connected to the drains of transistors M0 and M1, a source connected to a power supply node, and a drain. Transistor M3 has a gate connected to the drains of transistors M0 and M1, a source connected to ground, and a drain connected to the drain of transistor M2.

In accordance with the present invention, transistors M2 and M3 have substantially the same length, e.g., 350$u$, while transistor M2 is four times as wide as transistor M3, e.g., M2=80$u$ and M1=20$u$. Since the mobility of electrons is about twice that of holes, transistor M2 sources twice (2 X) as much current as transistor M3 sinks. (Other lengths and widths can be used to obtain the two times (2 X) factor or another factor.) Thus, transistor M2 can pull up the voltage on the output of inverter 332 twice as fast as transistor M3 can pull down the voltage on the output of inverter 332.

As further shown in FIG. 3, buffer 300 additionally includes a p-channel driver transistor PD that has a gate connected to the output of inverter 332, a source connected to a power supply node, and a drain connected to an output node OUT. Since the gate of driver transistor PD is connected to the output of inverter 332, transistor M2 pulls up the voltage on the gate of driver transistor PD twice as fast as transistor M3 can pull down the voltage on the gate of driver transistor PD. As a result, driver transistor PD can be turned off faster than it can be turned on.

Buffer 300 also includes a pull down block 334 that includes a first pull down inverter 340 and a second pull down inverter 342. First pull down inverter 340 has an input connected to the intermediate node NINT, and an output, while a second pull down inverter 342 has an input connected to the output of inverter 340, and an output.

First pull down inverter 340 has a p-channel transistor M4 and an n-channel transistor M5. Transistor M4 has a gate connected to the intermediate node NINT, a source connected to a power supply node, and a drain. Transistor M5 has a gate connected to the intermediate node NINT, a source connected to ground, and a drain connected to the drain of transistor M4.

In accordance with the present invention, transistors M4 and M5 have substantially the same length, e.g., $350u$, while transistor M4 is four times (4X) as wide as transistor M5, e.g., M4=$16u$ and M5=$4u$. Since the mobility of electrons is about twice that of holes, transistor M4 sources twice as much current as transistor M5 sinks. (Other lengths and widths can be used to obtain the two times (2 X) factor or another factor.) Thus, transistor M4 can pull up the voltage on the input of inverter 342 twice as fast as transistor M5 can pull down the voltage on the input of inverter 342.

Second pull down inverter 342 has a p-channel transistor M6 and a n-channel transistor M7. Transistor M6 has a gate connected to the drains of transistors M4 and M5, a source connected to a power supply node, and a drain connected to the gate of driver transistor ND. Transistor M7 has a gate connected to the drains of transistors M4 and M5, a source connected to ground, and a drain connected to the drain of transistor M6.

In accordance with the present invention, transistors M6 and M7 have substantially the same length, e.g., $350u$, while transistor M7 is twice as wide as transistor M6, e.g., M6=$16u$ and M7=$32u$. Since the mobility of electrons is about twice that of holes, transistor M7 sinks four times (4 X) as much current as transistor M6 sources. (Other lengths and widths can be used to obtain the four times (4 X) factor or another factor.) Thus, transistor M7 can pull down the voltage on the output of inverter 342 four times as fast as transistor M6 can pull up the voltage on the output of inverter 342.

As further shown in FIG. 3, buffer 300 additionally includes an n-channel driver transistor ND that has a gate connected to the output of inverter 342, a source connected to ground, and a drain connected to an output node OUT. Since the gate of driver transistor ND is connected to the output of inverter 342, transistor M7 pulls down the voltage on the gate of driver transistor PD four times as fast as transistor M6 can pull up the voltage on the gate of driver transistor ND. As a result, driver transistor ND can be turned off faster than it can be turned on.

In operation, the gates of transistors M0/M1 and M4/M5 receive an edge of the clock signal CLK (that results from the clock signal IN propagating through inverter block 310) at substantially the same time. On a rising edge, transistors M1 and M5 turn on at substantially the same time (have substantially the same threshold voltage). However, because transistor M1 is five times (5 X) larger than transistor M5, transistor MI pulls down the voltage on the gates of transistors M2/M3 faster than transistor M5 can pull down the voltage on the gates of transistors M6/M7. As a result, transistor M2 turns on before transistor M6.

In addition, transistor M2 is more than four times (>4 X) larger than transistor M6. As a result, transistor M2 pulls up the voltage on the gate of driver transistor PD faster than transistor M6 can pull up the voltage on the gate of driver transistor ND. Thus, the voltage on the gate of driver transistor PD begins rising before the voltage on the gate of driver transistor ND, and rises faster than the voltage on the gate of transistor ND.

Figure 4A:
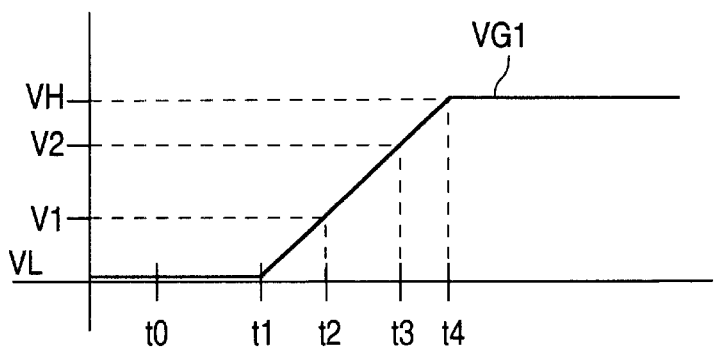
FIGS. 4A–4B are timing diagrams illustrating the operation of clock buffer 300 in accordance with the present invention.
Figure 4B:
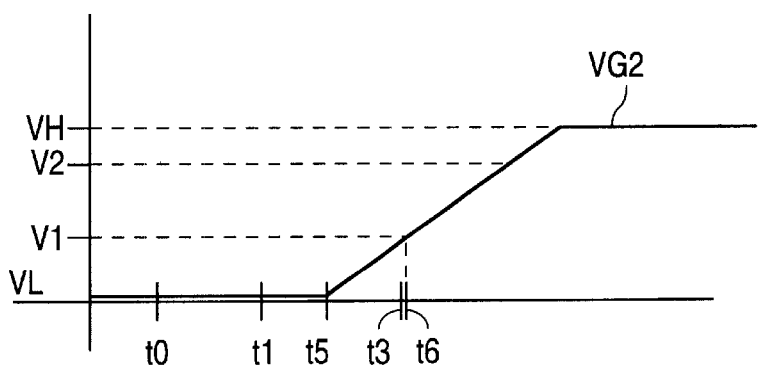

FIGS. 4A–4B show timing diagrams that illustrate the operation of clock buffer 300 in accordance with the present invention. As shown in FIG. 4A, a gate voltage VG1 on the gate of driver transistor PD starts as a logic low voltage VL at time t0, and begins transitioning from a logic low to a logic high at time t1. At time t2, gate voltage VG1 passes a voltage V1, and at time t3 gate voltage VG1 passes a turn off voltage V2 that turns off driver transistor PD. Gate voltage VG1 then reaches a logic high voltage VH at time t4.

As shown in FIG. 4B, a gate voltage VG2 on the gate of driver transistor ND also starts as a logic low voltage VL at time t0, but begins transitioning from a logic low to a logic high at time t5. Gate voltage VG2 begins transitioning later than gate voltage VG1 due to the difference in sizes between transistors M1 and M5, and M2 and M6.

Thus, gate voltage VG2 begins transitioning a delay time later where the delay time is equal to t5–t1.

In addition, gate voltage VG2 reaches voltage V1 at time t6. Gate voltage VG2 takes longer to reach voltage V1 once the transition begins because transistor M2 is larger than transistor M6. Thus, t6–t5> t2–t1. In accordance with the present invention, as shown in FIGS. 4A–4B, due to the delays provided by the different transistor sizes, gate voltage VG1 passes turn off voltage V2 (that turns off driver transistor PD) at time t3 before gate voltage VG2 passes turn on voltage V1 (that turns on driver transistor ND) at time t6. Since driver transistor PD turns off before driver transistor ND turns on, the crowbar current from transistor PD to transistor ND is substantially reduced.

A similar response occurs on the falling edge of the clock signal CLK. On the falling edge, transistors M0 and M4 turn on at substantially the same time. However, because transistor M4 is larger than transistor M0, transistor M4 pulls up the voltage on the gates of transistors M6/M7 faster than transistor M0 can pull up the voltage on the gates of transistors M2/M3. As a result, transistor M7 turns on before transistor M3.

In addition, transistor M7 is larger than transistor M3. As a result, transistor M7 pulls down the voltage on the gate of driver transistor ND faster than transistor M3 can pull down the voltage on the gate of driver transistor PD. Thus, the voltage on the gate of driver transistor ND begins falling before the voltage on the gate of driver transistor PD, and falls faster than the voltage on the gate of transistor PD.

Figure 5A:
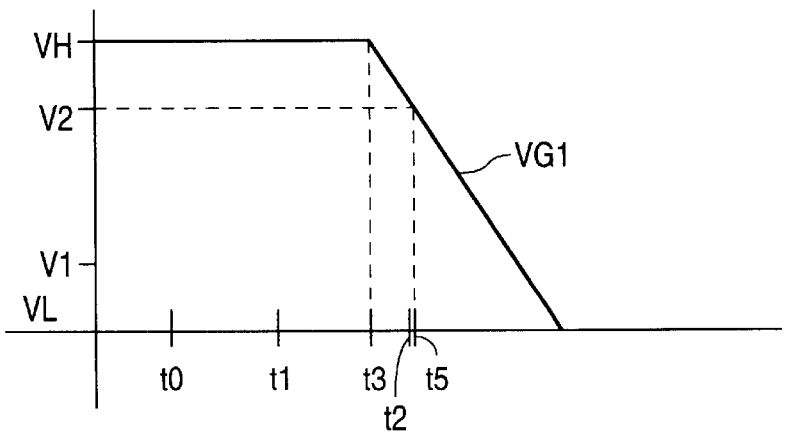
FIGS. 5A–5B are timing diagrams further illustrating the operation of clock buffer 300 in accordance with the present invention.
Figure 5B:
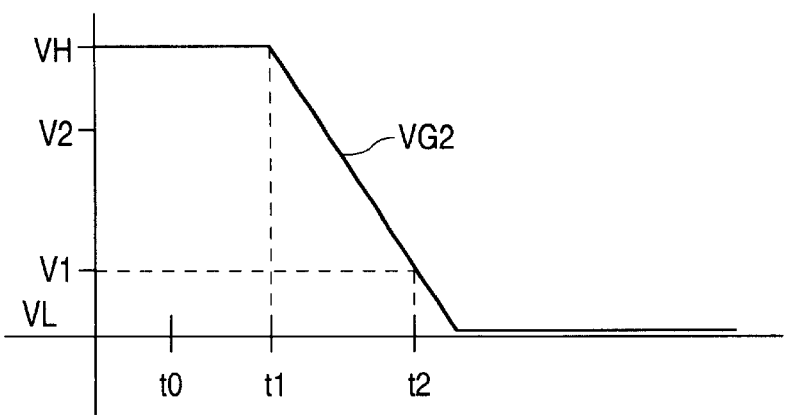

FIGS. 5A–5B show timing diagrams that further illustrate the operation of clock buffer 300 in accordance with the present invention. As shown in FIG. 5B, gate voltage VG2 on the gate of driver transistor ND starts as a logic high voltage VH at time t0, and begins transitioning from a logic high to a logic low at time t1. At time t2, gate voltage VG2 passes voltage V1, thereby turning off transistor ND.

As shown in FIG. 5A, gate voltage VG1 on the gate of driver transistor PD also starts as a logic high voltage VH at time t0, but begins transitioning from a logic high to a logic low at time t3. Gate voltage VG1 begins transitioning later than gate voltage VG2 due to the difference in sizes between transistors M0 and M4, and M3 and M7. Thus, gate voltage VG1 begins transitioning a delay time later where the delay time is equal to t3–t1.

In addition, gate voltage VG1 reaches voltage V2 at time t5. Gate voltage VG1 takes longer than voltage VG2 to reach voltage V2 once the transition begins because transistor M7 is larger than transistor M3. In accordance with the present invention, as shown in FIGS. 5A–5B, due to the delays provided by the different transistor sizes, gate voltage VG2 passes voltage V1 (that turns off driver transistor ND) at time t2 before gate voltage VG1 passes voltage V2 (that turns on driver transistor PD) at time t5. Since driver transistor ND turns off before driver transistor PD turns on, the crowbar current from transistor PD to transistor ND is substantially reduced.

Figure 6A:
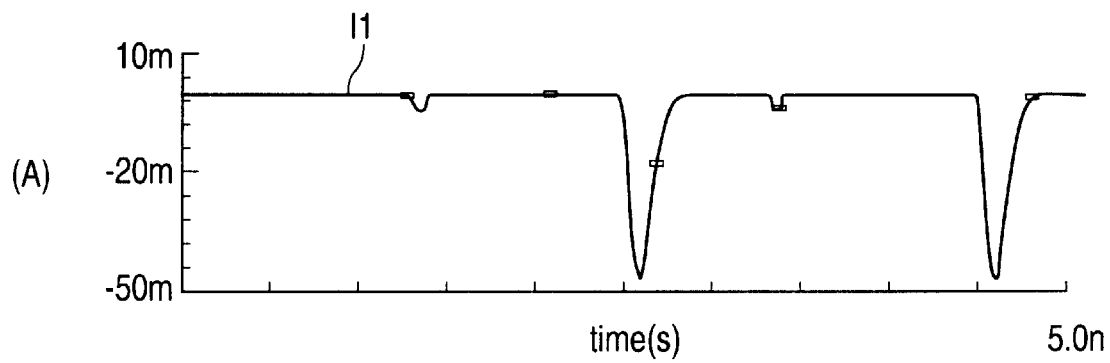
FIG. 6A is a timing diagram illustrating a simulated output transient current I1 from driver transistor PD of FIG. 3 in accordance with the present invention.
Figure 6B:
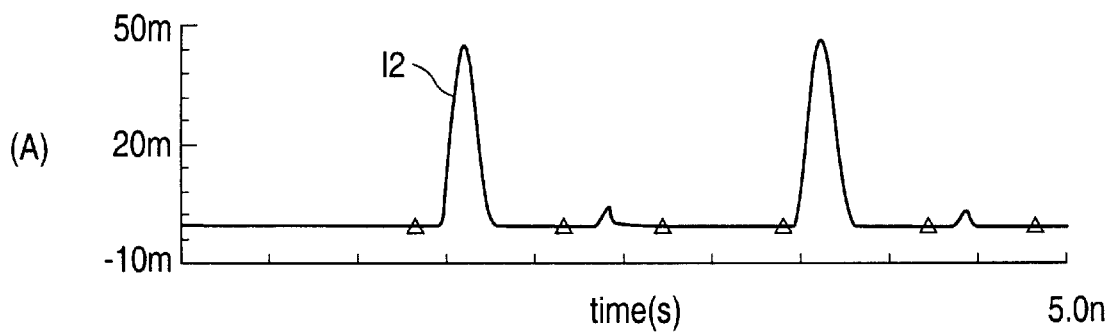
FIG. 6B is a timing diagram illustrating a simulated output transient current I2 from driver transistor ND of FIG. 3 in accordance with the present invention.
Figure 6C:
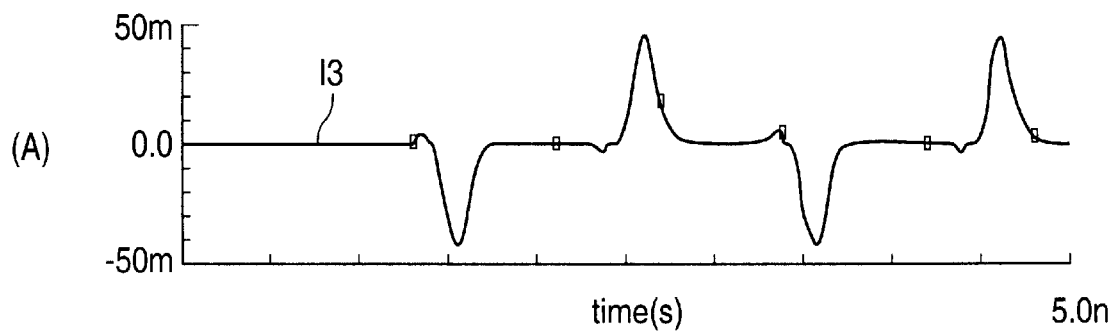
FIG. 6C is a timing diagram illustrating a simulated current I3 to charge and discharge the capacitance on the output node OUT in FIG. 3 in accordance with the present invention.

FIG. 6A shows a simulated output transient current I1 from driver transistor PD of FIG. 3 in accordance with the present invention. FIG. 6B shows a simulated output transient current I2 from driver transistor ND of FIG. 3 in accordance with the present invention. FIG. 6C shows a simulated current I3 to charge and discharge the capacitance on the output node OUT in FIG. 3 in accordance with the present invention.

Figure 7A:
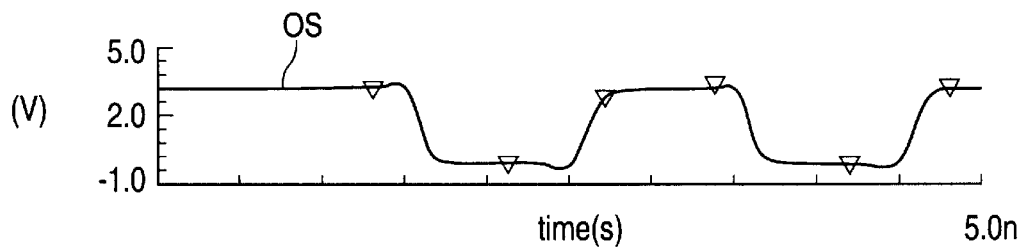
FIG. 7A is a timing diagram illustrating an output signal OS on the output node OUT of FIG. 3 in accordance with the present invention.
Figure 7B:
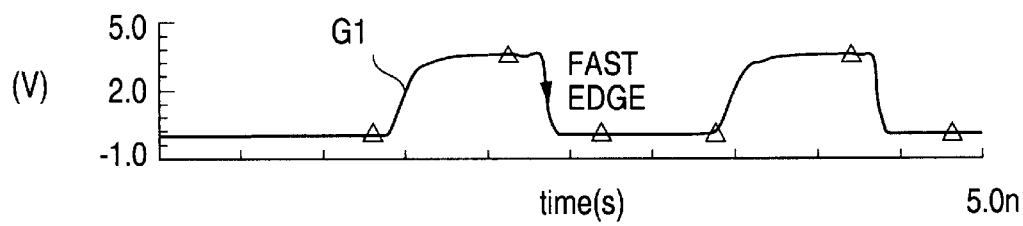
FIG. 7B is a timing diagram illustrating a gate voltage G1 on transistor ND of FIG. 3 in accordance with the present invention.
Figure 7C:
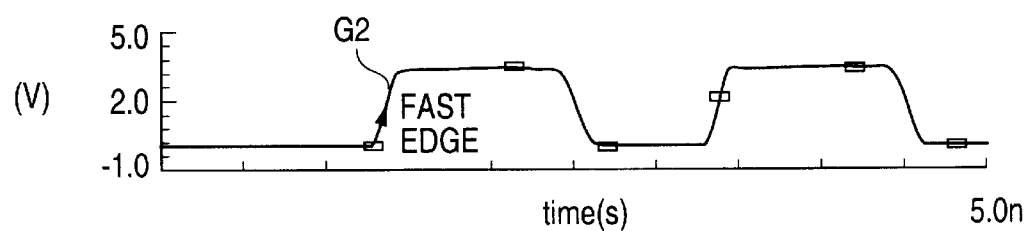
FIG. 7C is a timing diagram illustrating a gate voltage G2 on transistor PD of FIG. 3 in accordance with the present invention.
Figure 7D:
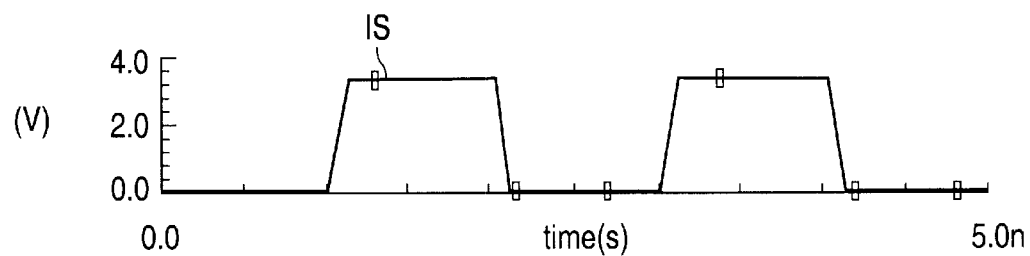
FIG. 7D is a timing diagram illustrating an input signal IS input to the first inverter of inverter block 310 in accordance with the present invention.

FIG. 7A shows an output signal OS on the output node OUT of FIG. 3 in accordance with the present invention. FIG. 7B shows a gate voltage G1 on transistor ND of FIG. 3 in accordance with the present invention. FIG. 7C shows a gate voltage G2 on transistor PD of FIG. 3 in accordance with the present invention. FIG. 7D shows an input signal IS input to the first inverter of inverter block 310 in accordance with the present invention.

Thus, a clock buffer has been described that significantly reduces the crowbar current that occurs during the rising and falling edges of the clock signal. Reducing the crowbar current reduces power consumption, increases circuit response time, and reduces noise on the power and ground lines.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A buffer comprising:

a pull up block that receives an input signal, the input signal having a plurality of edges, the pull up block outputting a first signal in response to the input signal a delay time after the input signal is received, the first signal beginning a transition from a first logic level to a second logic level at a first time, the pull up block having:

a first inverter having an input connected to receive the input signal, and an output, the first inverter including a first p-channel transistor and a first n-channel transistor connected to the first p-channel transistor, the first n-channel transistor having a length and a width, and being wider than the first p-channel transistor; and a second inverter having an input connected to the output of the first inverter, and an output that outputs the first signal;

a first driver transistor connected to the pull up block and an output node, the first driver transistor receiving the first signal, sourcing a first current to the output node when a voltage level of the first signal is in a first voltage range, and stopping the first current when the voltage level of the first signal is in a second voltage range;

a pull down block connected to the pull up block, the pull down block receiving the input signal and outputting a second signal in response to the input signal a delay time after the input signal is received, the second signal beginning a transition from the first logic level to the second logic level at a second time, the second time being different from the first time, the pull down block having:

a third inverter having an input connected to receive the input signal, and an output; and a fourth inverter having an input connected to the output of the third inverter, and an output that outputs the second signal; and a second driver transistor connected to the pull down block and the output node, the second driver transistor receiving the second signal, sinking a second current from the output node when a voltage level of the second signal is in a first voltage range, and stopping the second current when the voltage level of the second signal is in a second voltage range.

2. The buffer of claim 1 wherein the first signal has a rising edge with a first slope, and a falling edge with a second slope; and wherein the second signal has a rising edge with third slope, and a falling edge with a fourth slope, the first slope being steeper than the third slope.

3. The buffer of claim 1 wherein the first signal has a rising edge with a first slope, and a falling edge with a second slope; and wherein the second signal has a rising edge with third slope, and a falling edge with a fourth slope, the fourth slope being steeper than the second slope.

4. The buffer of claim 1 wherein the first signal has a rise time and a fall time, the rise time being shorter than the fall time.

5. The buffer of claim 4 wherein the second signal has a rise time and a fall time, the rise time of the second signal being shorter than the fall time of the second signal.

6. The buffer of claim 1 wherein the second inverter includes a second p-channel transistor and a second n-channel transistor connected to the second p-channel transistor, the second p-channel transistor having a length and a width, and being wider than the second n-channel transistor.

7. The buffer of claim 6 wherein the third inverter includes a third p-channel transistor and a third n-channel transistor connected to the third p-channel transistor, the third p-channel transistor having a length and a width, and being wider than the third n-channel transistor.

8. The buffer of claim 7 wherein the second inverter includes a fourth p-channel transistor and a fourth n-channel transistor connected to the fourth p-channel transistor, the fourth n-channel transistor having a length and a width, and being wider than the second p-channel transistor.

9. The buffer of claim 1 wherein the first current is substantially stopped before the second current begins.

10. The buffer of claim 9 wherein the second current is substantially stopped before the first current begins.

11. The buffer of claim 1 and further comprising:
a fifth inverter having an input and an output; and
a sixth inverter having an input connected to the output of the fifth inverter, and an output that outputs the input signal.

12. The buffer of claim 1 wherein the first signal begins the transition before the second signal when the first logic level is a logic low.

13. The buffer of claim 1 wherein the second signal begins the transition before the first signal when the first logic level is a logic high.

14. The buffer of claim 1 wherein the first inverter and the third inverter receive an edge of the input signal at substantially a same time.

15. The buffer of claim 1 wherein the first p-channel transistor and the first n-channel transistor have an equal length.

16. The buffer of claim 1 wherein the first driver transistor stops the first current before the second driver transistor sinks the second current when a voltage on the output node falls.

17. The buffer of claim 1 wherein the second driver transistor stops the second current before the first driver transistor sources the first current when a voltage on the output node rises.

18. A method of driving a capacitive load, the method comprising the steps of:
inverting an input signal to form a first intermediate signal, the first intermediate signal having a first rise time and a first fall time, the first fall time being shorter than the rise time;
inverting the first intermediate signal to form a first output signal, the first output signal having a second rise time and a second fall time, the second rise time being shorter than the second fall time;
sourcing a first load current into an output node when the first output signal is applied to the gate of a driver transistor that is connected to the output node, and positioned in a first voltage range, and stopping the first load current when the first output signal is in a second voltage range;
inverting the input signal to form a second intermediate signal, the second intermediate signal having a third rise time and a third fall time, the third rise time being shorter than the third fall time;
inverting the second intermediate signal to form a second output signal, the second output signal having a fourth rise time and a fourth fall time, the fourth fall time being shorter than the fourth rise time; and
sinking a second load current from the output node when the second output signal is in a first voltage range, and stopping the second load current when the second output signal is in a second voltage range.

19. The method of claim 18 wherein the first load current is substantially stopped before the second load current begins.

20. The method of claim 19 wherein the second load current is substantially stopped before the first load current begins.

21. A buffer comprising:
a first block that receives an input signal, the input signal having a plurality of edges the first block outputting a first signal in response to the input signal a delay time after input signal is received, the first signal beginning a transition from a first logic level to a second logic level at a first time, the first block having:
a first inverter having an input connected to receive the input signal, and an output, the first inverter including a first p-channel transistor and a first n-channel transistor connected to the first p-channel transistor, the first p-channel transistor having a length, a width, and an area defined by the length and width, the first n-channel transistor having a length and a width and an area defined by the length and width of the first n-channel transistor, the first n-channel transistor having a greater area than the first p-channel transistor; and
a second inverter having an input connected to the output of the first inverter, and an output that outputs the first signal;
a first driver transistor connected to the first block and an output node, the first driver transistor receiving the first signal, turning on and sourcing a first current to the output node when a voltage level of the first signal is in a first voltage range, and turning off when the voltage level of the first signal is in a second voltage range;
a second block connected to the first block, the second block receiving the input signal and outputting a second signal in response to the input signal a delay time after the input signal is received, the second signal beginning a transition from the first logic level to the second logic level at a second time, the second time being different from the first time, the second block having:
a third inverter having an input connected to receive the input signal, and an output; and
a fourth inverter having an input connected to the output of the third inverter, and an output that outputs the second signal; and
a second driver transistor connected to the second block and the output node, the second driver transistor receiving the second signal, turning on and sinking a second current from the output node when a voltage level of the second signal is in a first voltage range, and turning off when the voltage level of the second signal is in a second voltage range.

22. The buffer of claim 21 wherein the first driver transistor is turned off before the second driver transistor is turned on when a voltage on the output node falls.

23. The buffer of claim 21 wherein the second driver transistor is turned off before the first driver transistor is turned on when a voltage on the output node rises.

24. The buffer of claim 21 wherein:
the second inverter includes a second p-channel transistor and a second n-channel transistor connected to the second p-channel transistor; and
the third inverter includes a third p-channel transistor and a third n-channel transistor connected to the third p-channel transistor, the third p-channel transistor having a length, a width, and an area defined by the length and width of the third p-channel transistor, the third n-channel transistor having a length and a width and an area defined by the length and width of the third n-channel transistor, the third p-channel transistor having a greater area than the third n-channel transistor.

25. The buffer of claim 21 wherein the first current is substantially stopped before the second current begins.

26. The buffer of claim 21 wherein the second current is substantially stopped before the first current begins.

27. The buffer of claim 21 wherein the first inverter and the third inverter receive an edge of the input signal at substantially a same time.

* * * * *

UNITED STATES PATENT AND TRADEMARK OFFICE
CERTIFICATE OF CORRECTION

PATENT NO.    : 6,529,050 B1
DATED         : March 4, 2003
INVENTOR(S)   : Kuo et al.

It is certified that error appears in the above-identified patent and that said Letters Patent is hereby corrected as shown below:

Column 9,
Line 31, after "the" insert -- first --.
Line 63, after "edges" insert -- , --.
Line 65, after "after" insert -- the --.

Signed and Sealed this

Eighth Day of April, 2003

JAMES E. ROGAN
*Director of the United States Patent and Trademark Office*